United States Patent
Balasubramanyam et al.

[11] Patent Number: 5,923,999
[45] Date of Patent: Jul. 13, 1999

[54] METHOD OF CONTROLLING DOPANT DIFFUSION AND METAL CONTAMINATION IN THIN POLYCIDE GATE CONDUCTOR OF MOSFET DEVICE

[75] Inventors: Karanam Balasubramanyam, Hopewell Junction; Stephen Bruce Brodsky, Fishkill; Richard Anthony Conti, Mount Kisco, all of N.Y.; Badih El-Kareh, Austin, Tex.

[73] Assignee: International Business Machines Corporation, Armonk, N.Y.

[21] Appl. No.: 08/741,159

[22] Filed: Oct. 29, 1996

[51] Int. Cl.⁶ .................. H01L 21/3205; H01L 21/4763
[52] U.S. Cl. ...................... 438/592; 438/585; 257/413
[58] Field of Search .................................. 438/585, 592; 257/413

[56] References Cited

U.S. PATENT DOCUMENTS

| | | | |
|---|---|---|---|
| 4,900,257 | 2/1990 | Maeda | 438/592 |
| 5,164,333 | 11/1992 | Schwalke et al. | |
| 5,319,245 | 6/1994 | Chen et al. | 257/751 |
| 5,364,803 | 11/1994 | Lur et al. | |
| 5,414,301 | 5/1995 | Thomas | 257/740 |
| 5,439,831 | 8/1995 | Schwalke et al. | |
| 5,451,545 | 9/1995 | Ramaswami et al. | 437/200 |
| 5,543,362 | 8/1996 | Wu | |
| 5,604,140 | 2/1997 | Byun | |
| 5,656,519 | 8/1997 | Mogami | 438/303 |
| 5,733,816 | 3/1998 | Iyer et al. | 438/592 |
| 5,736,455 | 4/1998 | Iyer et al. | 438/592 |
| 5,776,823 | 7/1998 | Agnello et al. | 438/592 |

OTHER PUBLICATIONS

"Metal Diffusion Barrier Composite In Polycide Process", Research Disclosure, (Mar. 1986) p. 263.

Primary Examiner—Richard A. Booth
Attorney, Agent, or Firm—Daryl K. Weff; Charles W. Peterson; Graham S. Jones, II

[57] ABSTRACT

A MOSFET device is formed on a P– doped semiconductor substrate with an N– well formed therein, with a pair of isolation regions formed in the N– well with a gate oxide layer formed above the N– well. An FET device is formed with source and drain regions within the N-well, and a gate electrode formed above the gate oxide layer aligned with the source and drain regions. The gate electrode comprises a stack of layers. A polysilicon layer is formed on the gate oxide layer. A tungsten nitride dopant barrier layer is formed upon the polysilicon layer having a thickness of from about 5 nm to about 20 nm, and a tungsten silicide layer is formed upon the tungsten nitride layer.

23 Claims, 15 Drawing Sheets

METHOD OF CONTROLLING DOPANT DIFFUSION AND METAL CONTAMINATION IN THIN POLYCIDE GATE CONDUCTOR OF MOSFET DEVICE

BACKGROUND OF THE INVENTION

1. Field of the Invention

This invention relates to semiconductor devices and more particularly to Metal Oxide Semiconductor (MOS) Field Effect Transistor (FET) devices.

2. Description of Related Art

A typical polycide gate stack in a DRAM device includes a gate electrode stack, referred to below as a GC stack, that consists of the following composite sequence of layers: silicon/gate oxide/N+ doped polysilicon/$WSi_x$/Cap-Insulator. The patterned N+ doped polysilicon and $WSi_x$ layers comprise the gate conductor (GC) in the gate electrode stack.

Fabrication of the polycide structure consists of an in situ doped polysilicon deposition, or polysilicon (or amorphous silicon) deposition followed by implantation of As+ or P+, followed in turn by wet cleaning and tungsten ($WSi_x$) deposition either by sputtering or CVD (Chemical Vapor Deposition.) The problems encountered during the above process are as follows:

1) During post GC stack heat cycles, the dopant atoms in the polysilicon migrate into the $WSi_x$ layer. FIG. 21 shows a Secondary Ion Mass Spectrometry (SIMS) arsenic (As+) profile of the GC stack of 500 Å N+ doped polysilicon/500 Å $WSi_{2.8}$/2000 Å $Si_3N_4$. The profile shows dopant concentration versus depth from the surface of the GC stack. During the process, the dopant is distributed and piles up at the polysilicon/$WSi_x$ and $WSi_x$/cap silicon nitride interfaces. Migration and pile up of dopants reduces the dopant concentration at the polysilicon/gate oxide interface resulting in a partially depleted gate that normally degrades the FET performance by increasing the equivalent oxide thickness $t_{eq}$.

2) High-dose implantation and thin film deposition steps frequently result in metal contamination of polysilicon and subsequent metal penetration into the gate oxide and silicon substrate, thereby degrading the oxide integrity and reliability and reducing the DRAM cell retention time.

3) In dual workfunction CMOS (N+ polysilicon for NMOS and P+ polysilicon for PMOS), boron penetration through the PMOS gate degrades the gate oxide and MOSFET performance. Special precautions must be taken to avoid or minimize boron penetration, however, at the cost of increased process complexity and reduced flexibility. One example is the necessary avoidance of a nitride cap that is known to enhance penetration by generating excess hydrogen.

U.S. Pat. No. 5,414,301 of M. E. Thomas for "High Temperature Interconnect System for an Integrated Circuit" describes use of Tungsten Nitride and Tungsten Silicide for barrier layers and interconnections in transistor structures; Col. 1, lines 5–15; Col. 2, lines 27–68; Col. 3, Lines 1–31; Col. 4, lines 34–68; Col. 5, lines 1–68; Col. 6, lines 1–28). As the title suggests, the Thomas patent is related to interconnects and not to a MOSFET gate stack. The main purpose of deposited barrier films is to inhibit the transport of silicon and subsequent creation of "spikes" in junctions, when the structure is subjected to temperatures in excess of 500° C. The structure emphasizes titanium silicide and titanium nitride and focuses on electromigration and the Kirkendall effect in bipolar structures. In contrast, the present invention uses tungsten nitride as a barrier in conjunction with tungsten silicide in a polysilicon gate stack to inhibit the migration of metals and dopants toward and through the gate oxide which is a totally different approach and objective.

A publication entitled "Metal Diffusion Barrier Composite In Polycide Process" published in Research Disclosure, page 263 (March 1986) describes use of twin layers provided in a structure made by a polycide process. The first of the twin layers is a titanium nitride composite underlayer. The second of the twin layers is a thin metal layer composed of a metal selected from the group consisting of titanium, cobalt, and platinum. In the process disclosed, first a conducting, refractory metal nitride (TiN) layer is deposited on a polysilicon substrate. Next, the metal layer is deposited to complete the twin layers. Finally, a tungsten silicide layer is deposited over the composite twin metal layers (over the TiN layer). The twin layers act as a dopant diffusion barrier. However, in the publication the titanium nitride is used as the barrier metal and as an adhesion promoter. The path of dopant diffusion is not indicated. It appears that the method is aimed at inhibiting dopant diffusion from the source/drain regions.

U.S. Pat. No. 5,319,245 for "Local Interconnects for Integrated Circuits" of Chen et al. describes local interconnects for integrated circuits, where a refractory nitride is formed over the IC; and then a refractory metal silicide is deposited on the refractory nitride as a barrier layer (See Col. 1, lines 5–22; Col. 2, lines 1–16; Col. 3, lines 14–68; Col. 4, lines 1–46). The Chen et al. patent focuses on local interconnects. The method is illustrated for titanium, titanium nitride barrier, and tantalum silicide. The main objective is to form low-resistivity local interconnections (e.g., between source/drain and gate conductor) without causing "spikes" in the source/drain junctions. There is no mention of inhibiting metal or dopant diffusion into a gate oxide. The materials used are not suitable for this purpose due to their poor thermal stability.

U.S. Pat. No. 5,451,545, "Process for Forming Stable Local Interconnect/Active Area Silicide Structure VLSI Applications," of Ramaswami et al. describes a process in which titanium silicide is layered over a gate electrode; followed by a layer of titanium nitride; followed by a layer of titanium silicide; followed by a silicon (Si) layer (Col. 6–12, 45–68; Col. 2, lines 1–22; Col. 3, lines 1–68; Col. 4, lines 1–33). This patent also focuses on local interconnects. The materials used are titanium, titanium nitride, and titanium silicide. The main purpose is to form a barrier to oxygen, to improve adhesion and prevent peeling of the conducting film. The objectives, procedure, and materials used are completely different from those of the present invention.

SUMMARY OF THE INVENTION

An object of this invention is to prevent migration of dopant atoms from the polysilicon layer into the $WSi_x$ layer in post gate conductor (GC) heat cycles.

The present invention uses tungsten nitride as a barrier, resulting in a simpler stack and higher thermal stability than titanium nitride (TiN). The tungsten nitride is denoted by $W_yN$ before annealing and $W_2N$ after annealing at an appropriate temperature. In addition, the present invention is adapted for a MOSFET gate stack consisting of gate oxide, polysilicon, tungsten nitride, tungsten silicide, and low-pressure nitride cap insulator process. This stack withstands the post gate RIE reoxidation process and source/drain anneals employed when manufacturing a 256 Megabit DRAM. It is applicable to future DRAM and logic technologies. Because it withstands high temperatures, it aids in reducing the damage caused by reactive ion etching (RIE) and/or ion implantation, and hence junction and surface leakages. Of extreme importance, is the applicability of the present invention to dual work function gates (N+ polysilicon over NMOS, P+ polysilicon over PMOS). In the past, incorporating a dual work function CMOS process has suffered from boron penetration from P+ polysilicon into and through the gate oxide, degrading the PMOS.

The present invention inhibits boron penetration, even in the presence of a nitride cap.

In accordance with the method of this invention, a stable dopant diffusion barrier is formed i a polysilicon/$WSi_x$ structure to minimize outdiffusion of dopant from the polysilicon layer into the $WSi_x$ layer. The diffusion barrier thus prevents the depletion of dopants in polysilicon during post $WSi_x$ deposition annealing, and ensures that a high concentration (approximately $3 \times 10^{20}$ atoms/cm$^3$) of electrically active dopant material remains at the polysilicon/gate oxide interface to avoid an increase in the equivalent oxide thickness ($t_{eq}$) and the associated degradation in MOSFET performance.

The resultant structure thus consists of :

Si/Gate Oxide/doped (N+ or P+) polysilicon/$W_yN/WSi_x$/ Cap insulator.

A GC stack in accordance with this invention is illustrated for an N+ polysilicon gate as follows:

Si/Gate Oxide/N+ polysilicon/$W_yN/WSi_x$/Cap insulator.

The diffusion barrier (WyN) also prevents migration of metallic impurities (introduced during implantations and thin film depositions) from the $WSi_x$ layer to the underlying polysilicon and gate oxide.

BRIEF DESCRIPTION OF THE DRAWINGS

The foregoing and other aspects and advantages of this invention are explained and described below with reference to the accompanying drawings, in which:

FIG. 21 is a graph of arsenic diffusion through a polycide structure without a tungsten nitride ($W_2N$) barrier.

DESCRIPTION OF THE PREFERRED EMBODIMENT

FIGS. 1–13 illustrate a series of steps in a manufacturing process in accordance with this invention for making a MOSFET device 10. The device 10 is shown in the same sectional view for each step which illustrates the development of the device during its manufacture on a step-by-step basis.

Figure 1:
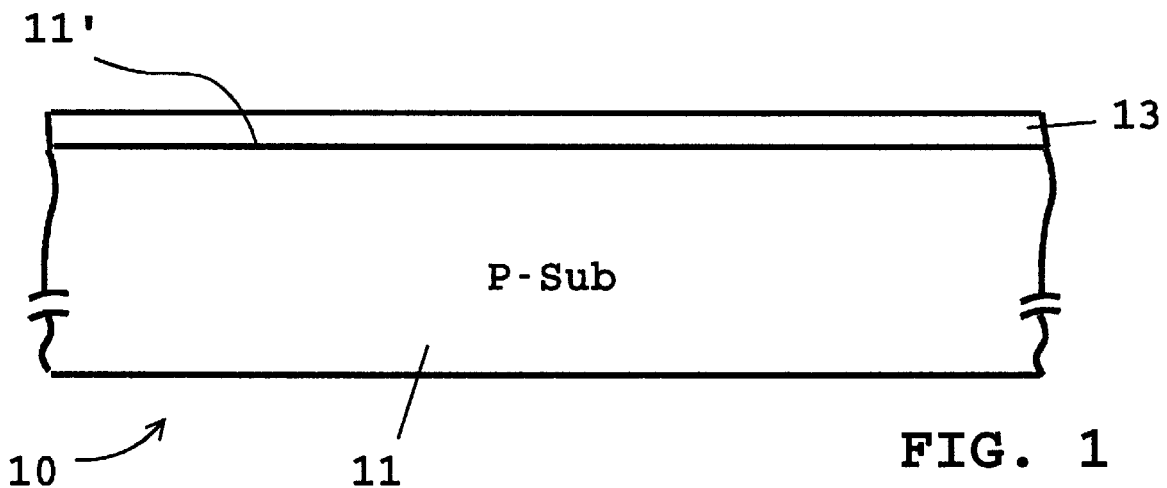
FIGS. 1–13 illustrate a series of steps in a manufacturing process in accordance with this invention for making a MOSFET device.

In FIG. 1, a device 10 is shown comprising a conventional P– doped silicon substrate 11 with a flat upper surface 11' upon which a thin blanket insulator layer 13 has been formed with a thickness of say 500 nm.

FIGS. 2, 3A, 3B and 4 illustrate one method of forming isolation regions for a device in accordance with this invention.

Figure 2:
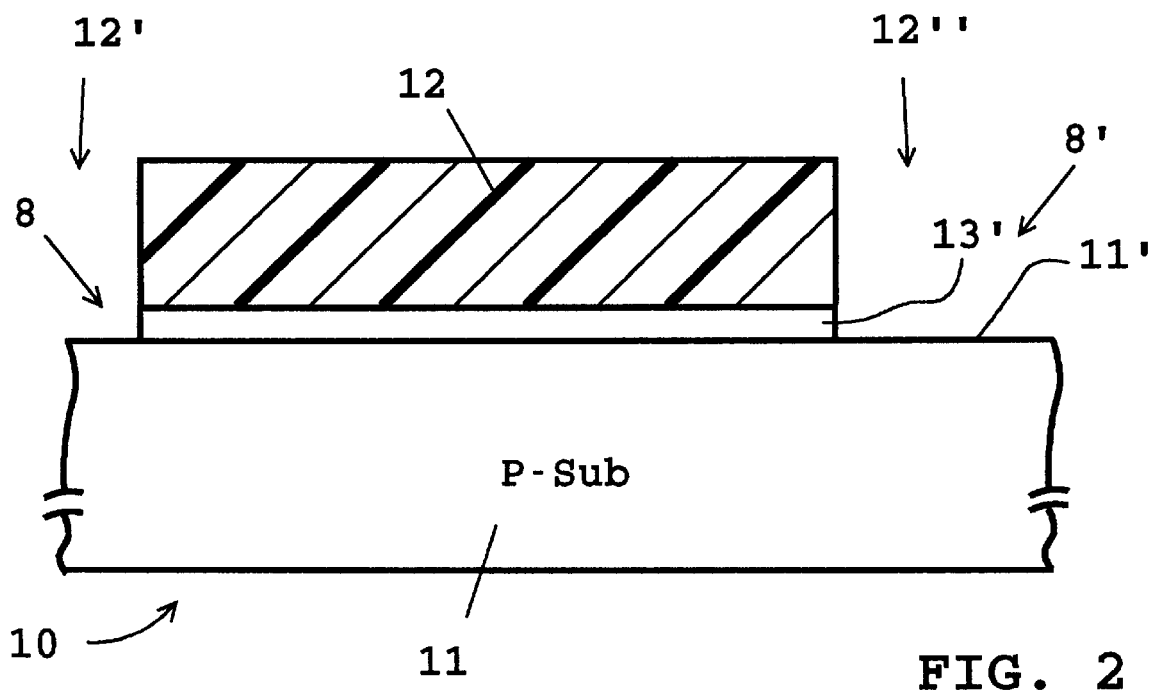

FIG. 2 shows the device 10 of FIG. 1 after a photoresist mask 12 with openings 12' and 12" on the right and left sides of device 10 therethrough has been used to pattern an underlying insulator 13 that will act as a stencil 13' to etch trenches in silicon substrate 11. Mask 12 has been formed over the surface of insulator layer 13 which has been patterned by etching into a stencil 13' with openings 8 and 8' on the right and left sides of device 10 below openings 12' and 12" down to surface 11' of silicon substrate 11.

Using the mask 12, the substrate 11 is etched away through the openings 12' and 12" by means of anisotropic RIE (Reactive Ion Etching) forming two shallow trenches 8 and 8' in substrate 11 with one of those trenches on either side of mask 12.

Figure 3A:
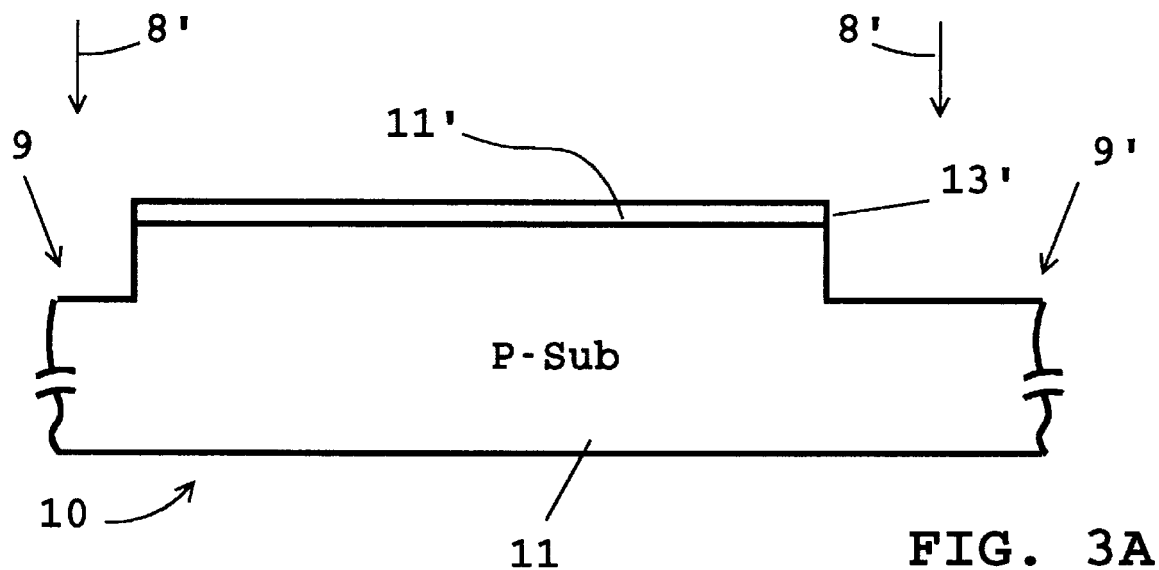

FIG. 3A shows the device 10 of FIG. 2 after mask 12 has been stripped from the device 10, and trenches 9 and 9' have been etched into the silicon substrate 11. Film 13 has been patterned to form a stencil 13' to etch shallow trenches 9 and 9' in substrate 11 below the openings 8 and 8' respectively in stencil 13'. The trenches typically surround the structure and may have different shapes. Trenches 9 and 9' have a depth of approximately 250-nm in silicon 11 which is provided by means of directional Reactive Ion Etching (RIE) through stencil 13', yielding the result shown in FIG. 3A.

Figure 3B:
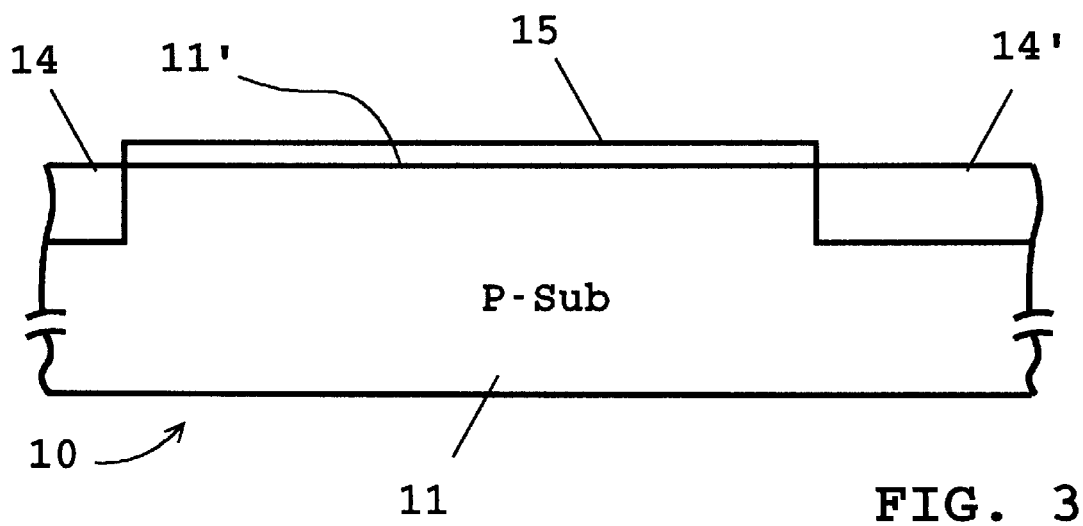

FIG. 3B shows the device 10 of FIG. 3A after an Shallow Trench Isolation (STI) oxide film (14, 14') has been deposited on the surface of the device 10, following which the surface of the oxide film has been polished, the stencil has been removed and a sacrificial oxide (silicon dioxide) layer 15 has been grown or deposited on the exposed silicon surfaces 11'. Trenches 9 and 9' are shown filled with oxide (silicon dioxide) that constitute Shallow Trench Isolation (STI) regions 14, 14'. To form the silicon dioxide STI regions 14 and 14' in the trenches 9 and 9' an insulator film (preferably silicon dioxide) of appropriate thickness is conformally deposited by a method such as Chemical Vapor Deposition (CVD), over the entire surface of device 10, filling trenches 9, 9'. The surface of the insulator film is then planarized by a method such as Chemical-Mechanical Polishing (CMP) and etching. A sacrificial oxide layer 15 about 15 nm thick is then formed over exposed silicon surfaces 11', typically by oxidation of silicon substrate 11 resulting in the structure seen in FIG. 3B.

It is obvious to anybody skilled in the art that other isolation schemes, such as local oxidation (LOCOS) or field oxide (FOX), can also be used with the preferred embodiment.

Figure 4:
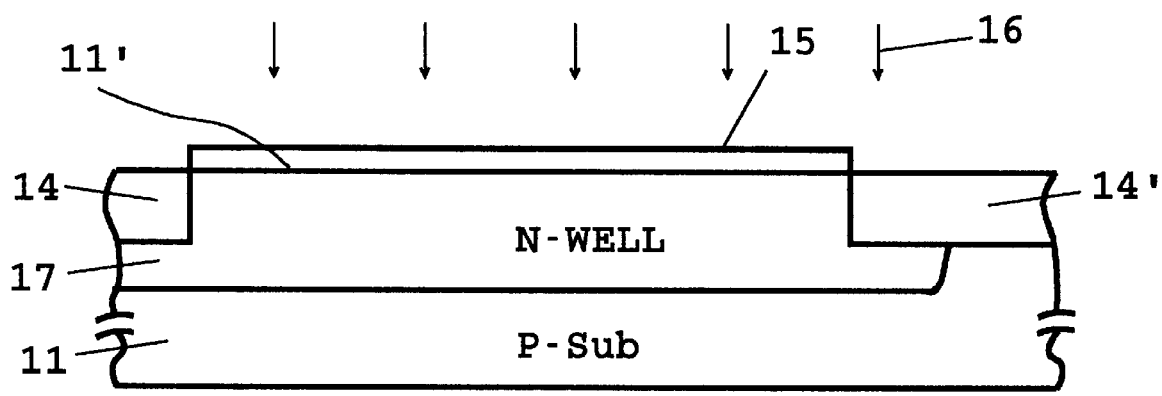

FIG. 4 shows the device 10 of FIG. 3 after implantation of N− type dopant ions 16 into the P− substrate 11 to form an N− well 17 therein. As will be well understood by those skilled in the art, a photoresist mask (not shown for convenience of illustration) is patterned to implant the N-well in selected regions where PMOSFETs are formed. A P-well is typically implanted over the rest of the wafer using another mask.

To form an N-well, phosphorus or arsenic ions 16 are implanted at a dose from about $10^{13}$ atoms/cm$^2$ to about $10^{14}$ atoms/cm$^2$ and at an energy that typically ranges from about 100 keV to about 1000 keV. The resultant impurity profile typically peaks at a concentration from about $10^{17}$ atoms/cm$^3$ to about $10^{18}$ atoms/cm$^3$.

Using the N-well mask, phosphorus and/or arsenic ions are ion implanted at a dose that can range from about $10^{12}$ atoms/cm$^2$ to about $10^{13}$ atoms/cm$^2$ and an energy from about 10 keV to about 100 keV to suppress punch-through and adjust the MOSFET threshold voltage.

While shallow trench regions are shown in FIG. 4, there may be several STI regions within one well.

Figure 5:
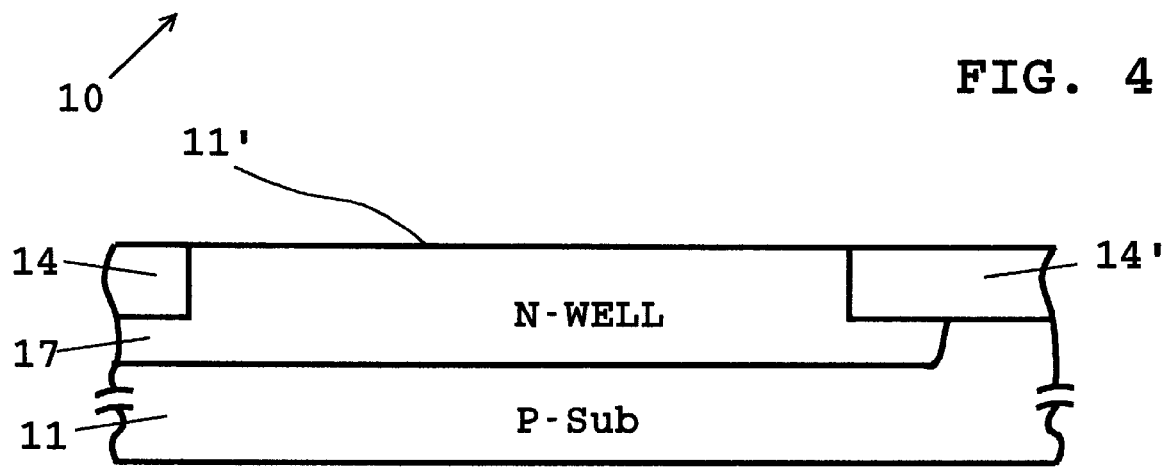

FIG. 5 shows the device 10 of FIG. 4 after the sacrificial oxide layer 15 has been stripped from the device 10 leaving the surface 11' of the N− well 17 exposed. For the sake of clarity the boundaries of threshold adjust and punch-through stop regions are not shown.

Figure 6:
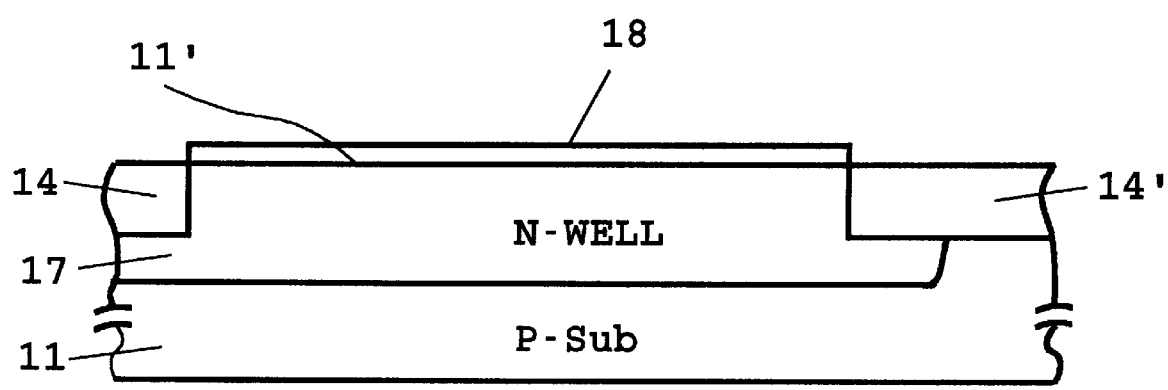

FIG. 6 shows the device 10 of FIG. 5 after a silicon dioxide gate oxide layer 18 (with a thickness from about 4 nm to about 20 nm) has been formed over the exposed surfaces 11'.

Figure 7:
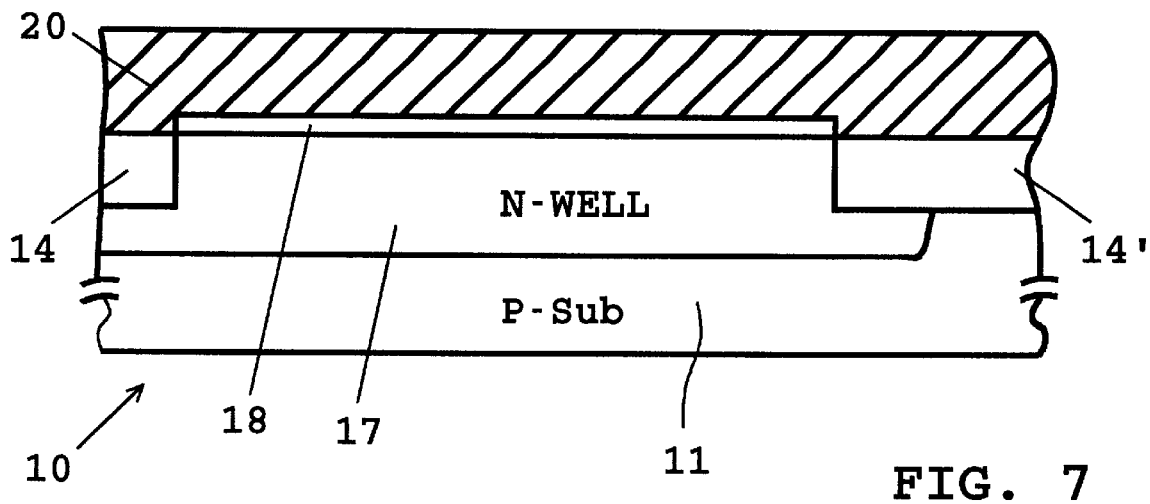

FIG. 7 shows the device 10 of FIG. 6 after a doped polysilicon layer 20 has been formed over the gate oxide layer 18 and the STI regions 14, 14'. Layer 20 has a thickness of about 100 nanometers. With an N+ doped polysilicon layer 20, the layer 20 is either doped by a conventional in situ doping process or doped after deposition by ion implantation. In dual function CMOS, the N+ polysilicon is typically doped with arsenic or phosphorus and the P+ polysilicon with boron, typically.

Figure 8:
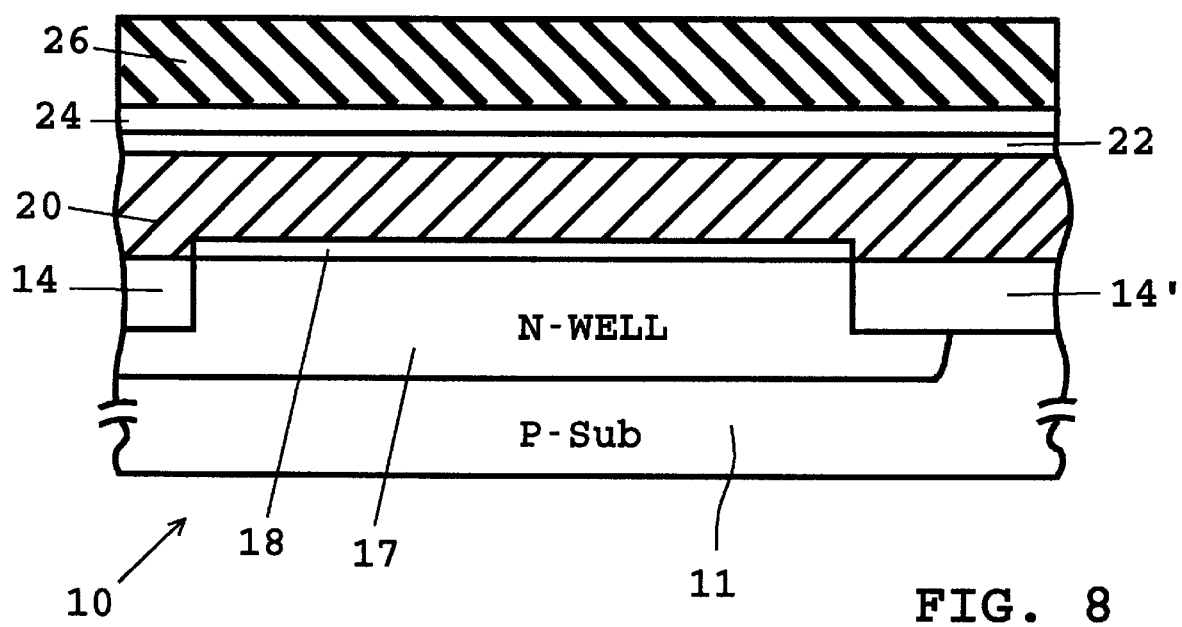

FIG. 8 shows the device 10 of FIG. 7 after deposition upon the exposed surface of polysilicon layer 20 of several layers starting with a tungsten nitride ($W_yN$) layer 22 with a thickness from about 5 nm to about 20 nm. Tungsten nitride ($W_yN$) layer 22 is formed over the doped polysilicon layer 20 by a process selected from reactive sputtering and Chemical Vapor Deposition (CVD) or sputtered tungsten plus and NH$_3$ anneal. A standard step of heating to 150° C. and degassing in a vacuum chamber is used prior to $W_yN$ deposition of tungsten nitride ($W_yN$) layer 22 and the $W_yN$ is sputtered using a tungsten target with the wafer unclamped and not heated. Tables I and II describe the process of reactive sputtering of the tungsten nitride ($W_yN$) layer 22.

TABLE I

TUNGSTEN NITRIDE ($W_yN$)
SPUTTERING PROCESS PARAMETERS

| POWER | GAS | FLOW RATE |
|---|---|---|
| 2000 W | Argon | is 20 sccm |
| 2000 W | N$_2$ | is 60 sccm |

TABLE II

TUNGSTEN NITRIDE ($W_yN$)
SPUTTERING DEPOSITION THICKNESS & TIME

| Thickness | Time |
|---|---|
| 20 nm (200Å) | 35.0 sec. |
| 15 nm (150Å) | 26.3 sec. |
| 10 nm (100Å) | 17.5 sec. |
| 5 nm (50Å) | 8.7 sec. |

Above the tungsten nitride ($W_yN$) layer 22 is formed a tungsten silicide ($WSi_x$) layer 24 with a thickness from about 50 nanometers to about 100 nanometers deposited by a CVD or sputtering process. The 50 nanometers thick layer can be sputtered during an interval of about 2.8 seconds.

Above the tungsten silicide ($WSi_x$) layer 24 is formed (preferably by a CVD process) a silicon nitride ($Si_3N_4$) cap layer 26 with a thickness from about 75 nanometers to about 200 nanometers. The silicon nitride ($Si_3N_4$) can be formed by Low Pressure CVD (LPCVD) at a temperature of from about 720° C. to about 800° C. for a time duration of from about 30 minutes to about 150 minutes.

Figure 9:
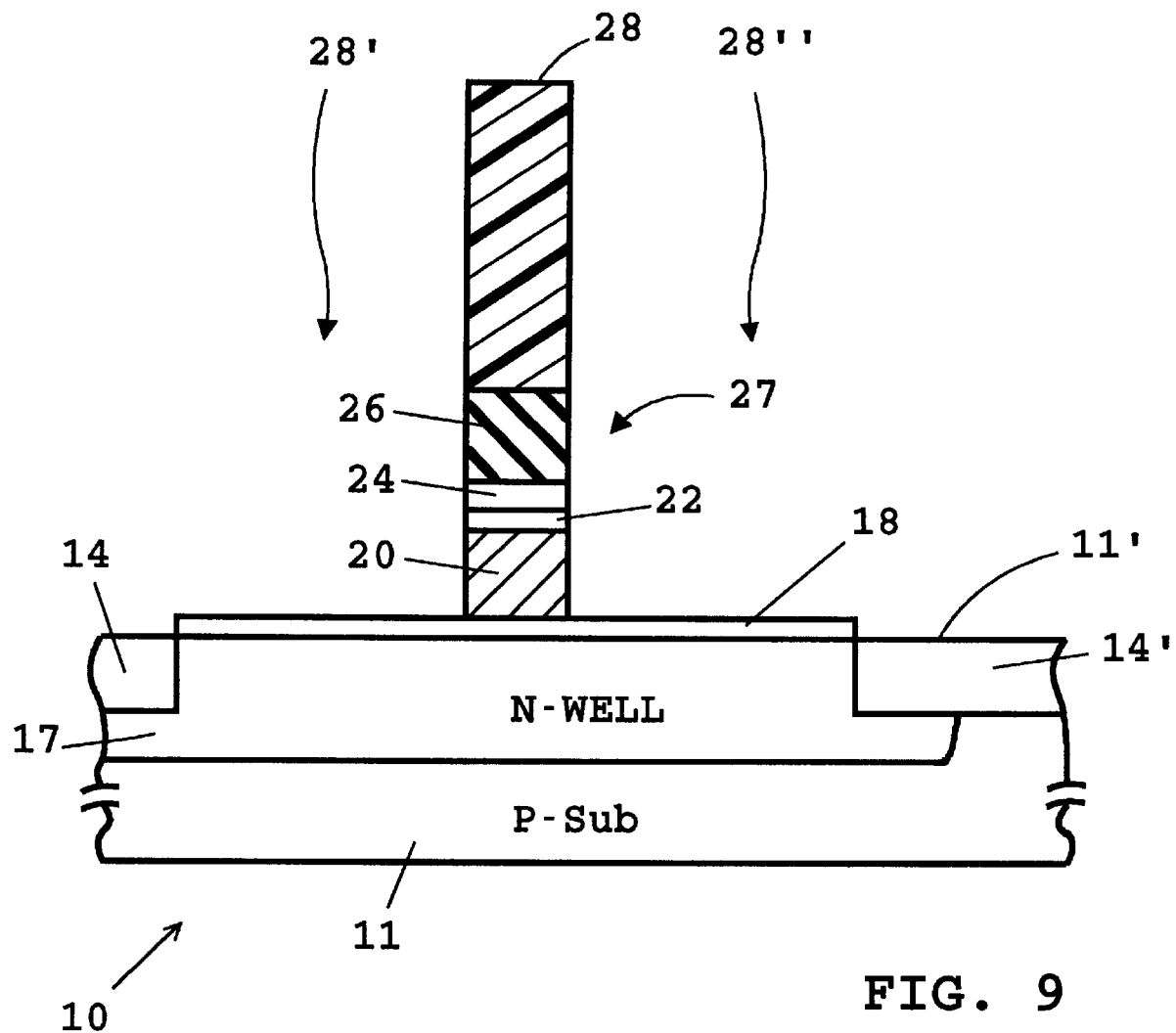

FIG. 9 shows the device 10 of FIG. 8 after a gate electrode photoresist mask 28 with windows 28' and 28" on the sides of the mask 28 has been formed over silicon nitride cap layer 26. Mask 28, which has a thickness of about 1 μm, is shown centrally between the STI regions 14, 14'. An isotropic vertical etching process has been performed through the window 28' and 28" through the layers 20, 22, 24 and cap layer 26 down to the gate oxide layer 18 and the STI regions 14, 14' converting the layers 20, 22, 24 and cap layer 26 into a stack 27 thereof leaving the sidewalls of the stack 27 exposed.

Figure 10:
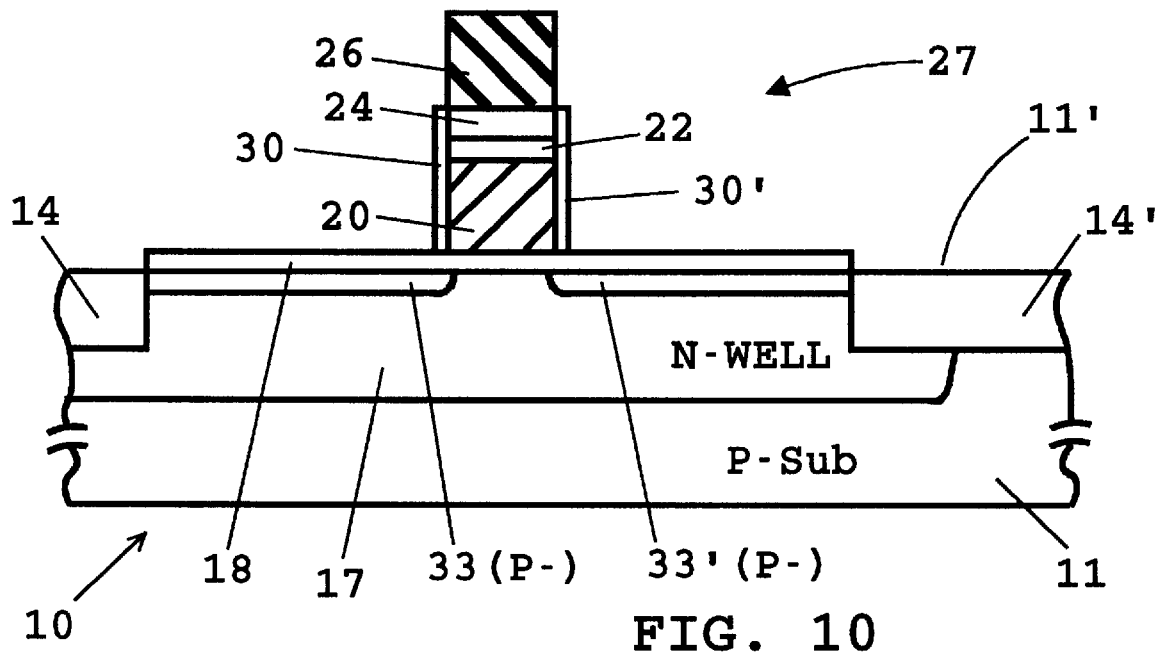

FIG. 10 shows the device 10 of FIG. 9 after oxidation of the gate conductor sidewalls. This step forms about 10 nanometer thick oxide layers 30, 30' on the sidewalls of stack 27. Layers 30, 30' have been formed adjacent to the sidewalls of the stack 27 (i.e. the sidewalls of layers 20, 22, 24).

Figure 11:
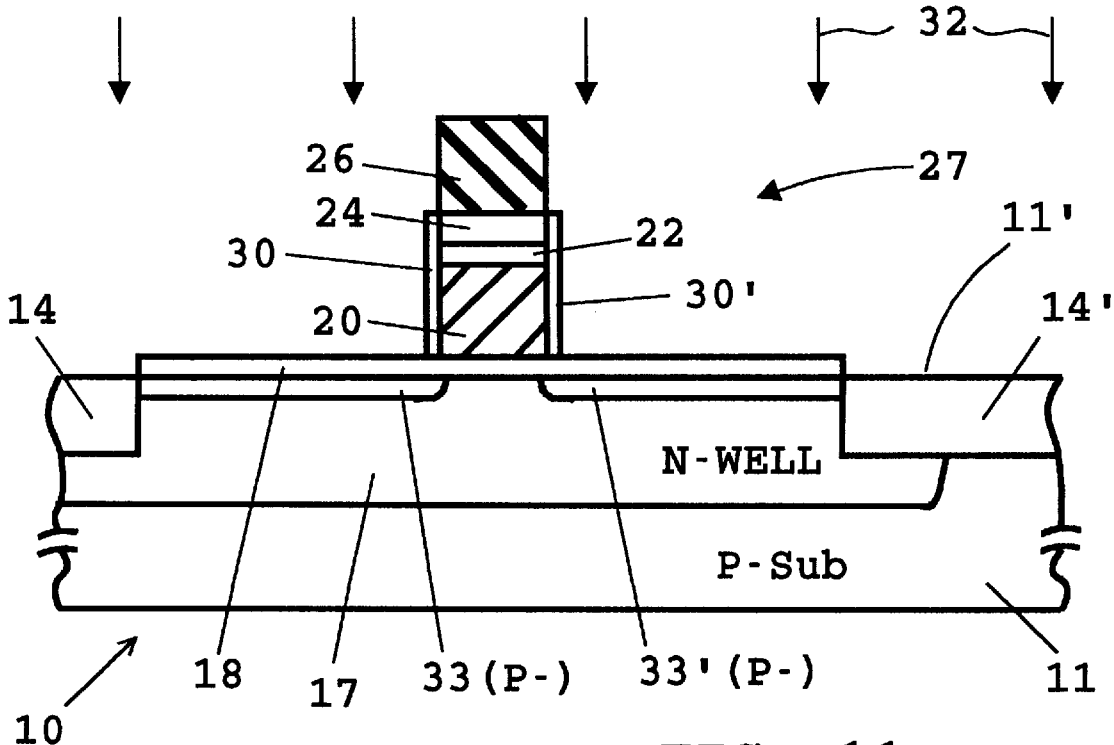

Next, FIG. 11 shows the device 10 of FIG. 11 during formation of optional conventional lightly doped P− source/drain extension regions 33, 33' in the N− well 17 on either side of the stack 27 by ion implantation of boron ions 32 at a dose that ranges from about $5 \times 10^{11}$ atoms/cm$^{-2}$ to about $5 \times 10^{12}$ atoms/cm$^{-2}$ at an energy of about 5 keV to about 10 keV of boron dopant.

Figure 12:
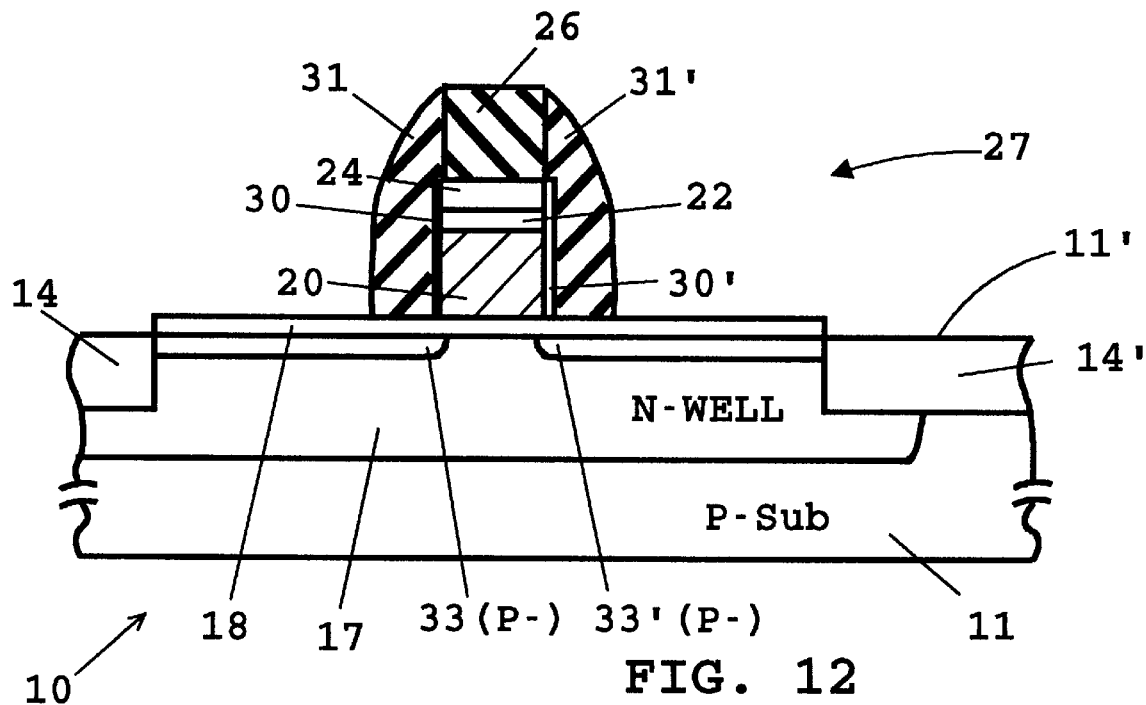

FIG. 12 shows a device 10 of FIG. 11 after formation of conventional silicon nitride ($Si_3N_4$) spacers 31 and 31' adjacent to the sidewall layers 30, 30' and stack 27 including the silicon nitride cap layer 26. The silicon nitride spacers 31 and 31' are formed by a conventional blanket deposition of a silicon nitride layer followed by a conventional directional (anisotropic) spacer etch by RIE (Reactive Ion Etching).

Figure 13:
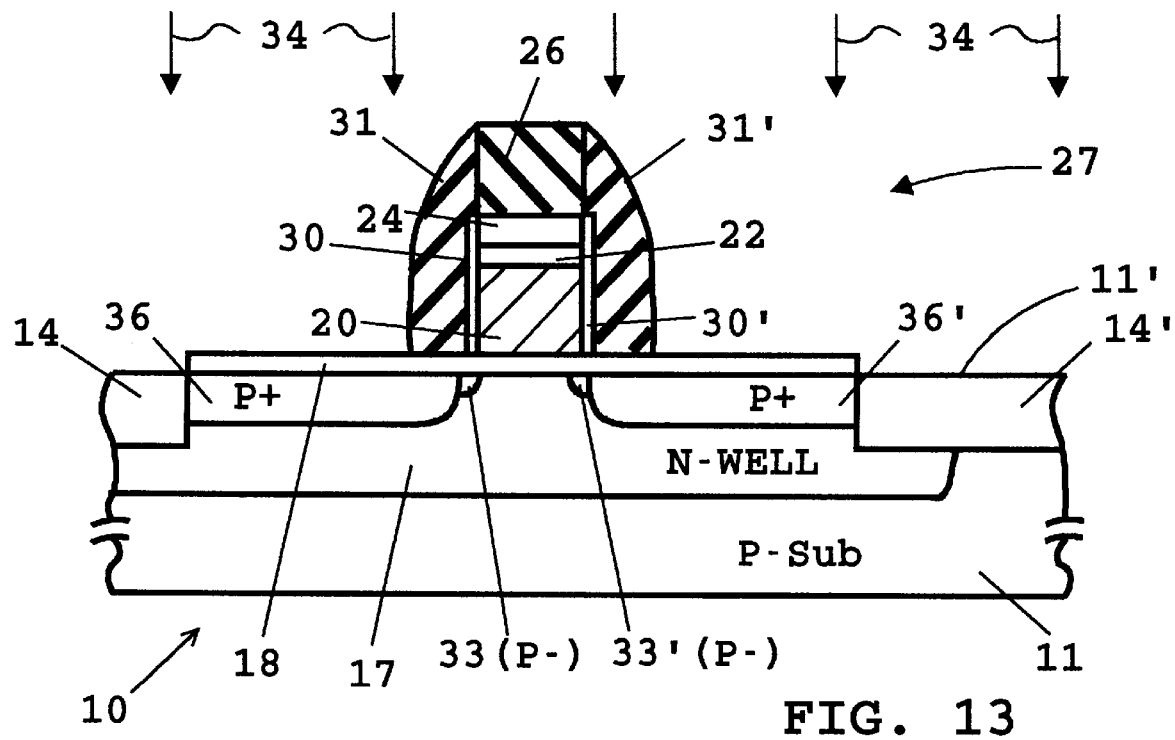

FIG. 13 shows the device 10 of FIG. 12 during self-aligned ion implantation of BF$_2$ to form PMOS source/drain regions 36/36' with dopant ions 34. The ions 34 are implanted with a does of from about $7 \times 10^{12}$ atoms/cm$^{-2}$ to about $7 \times 10^{14}$ atoms/cm$^{-2}$ at an energy of about 15 keV.

Method of Forming MOSFET Device

There are several methods of manufacturing a device 10 in accordance with the method of this invention.

Figure 14:
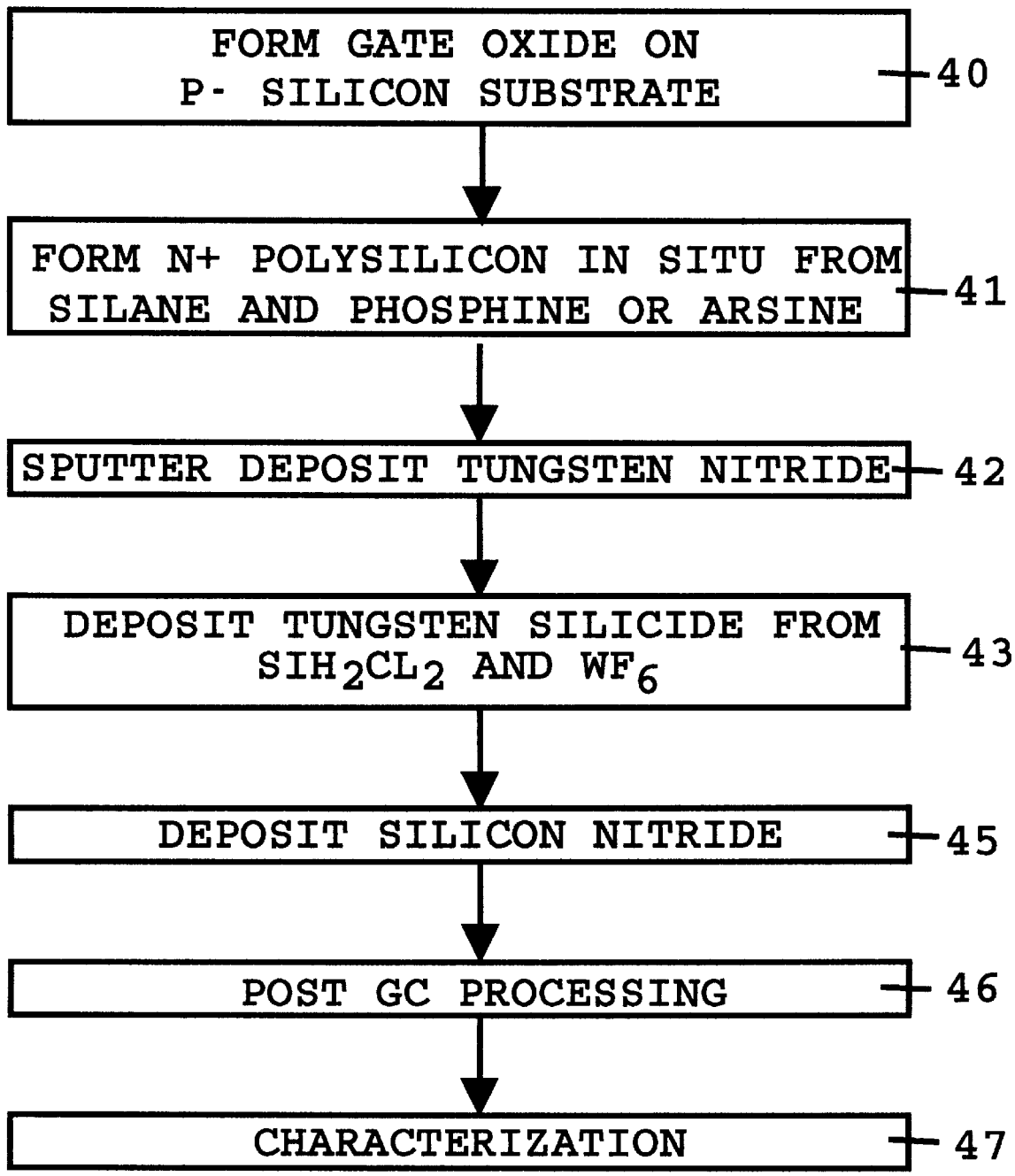
FIG. 14 shows a flow chart of a process for forming a gate electrode stack in accordance with this invention.

FIG. 14 shows a flow chart of a process for forming a gate electrode stack in accordance with this invention.

Figure 15:
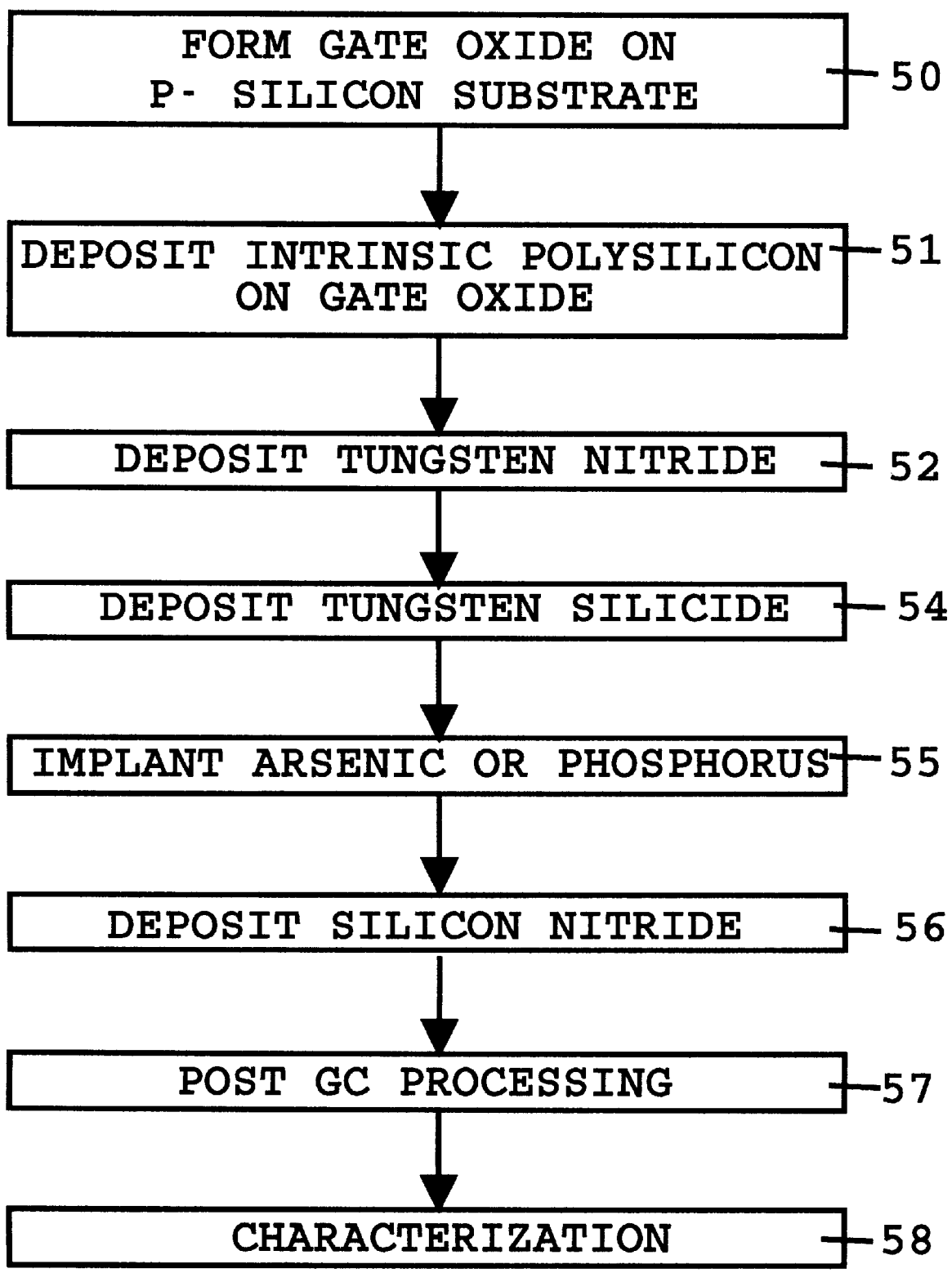
FIG. 15 shows a flow chart of an alternative process for forming a gate electrode stack in accordance with this invention.

FIG. 15 shows a flow chart of an alternative process for forming a gate electrode stack in accordance with this invention.

Figure 16:
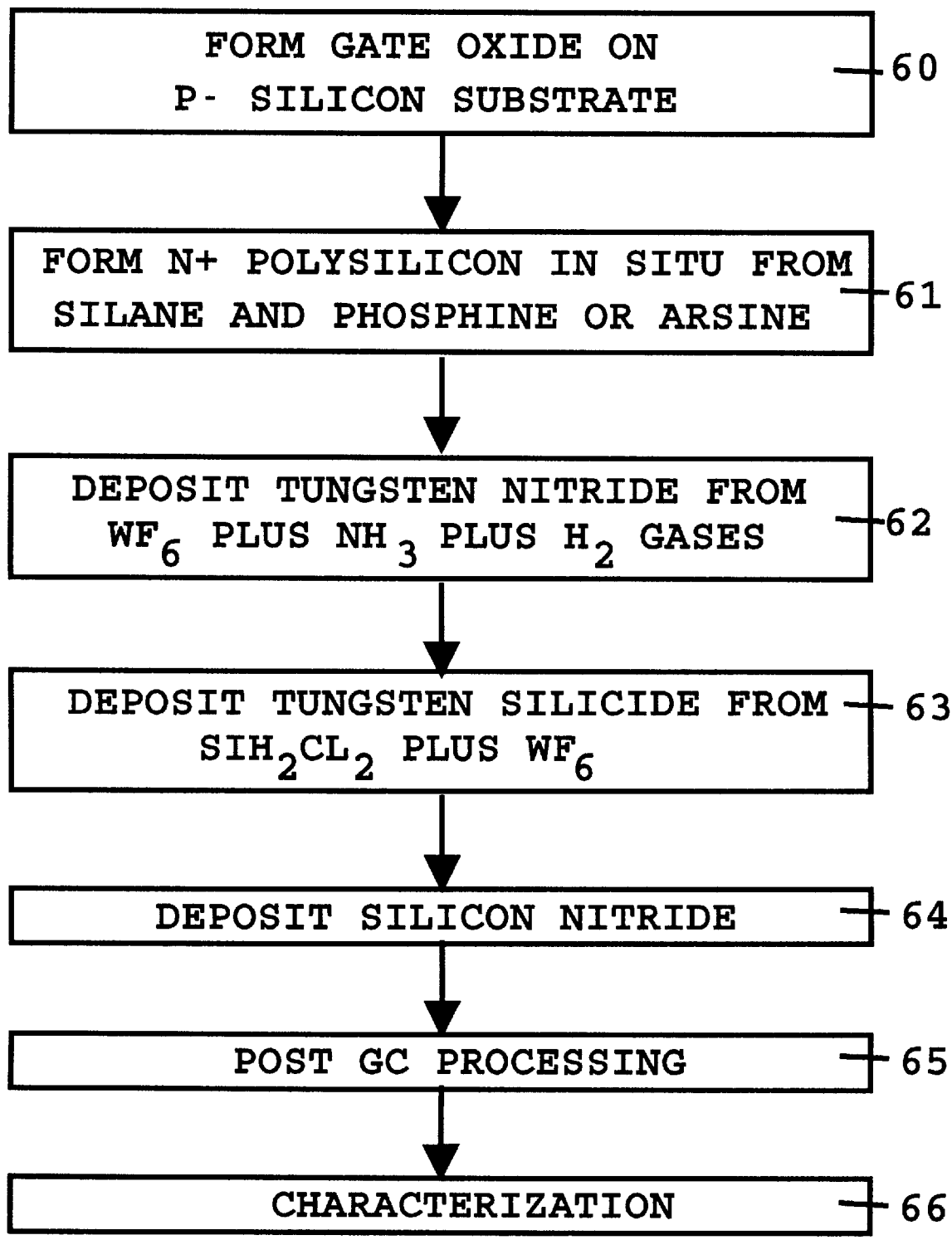
FIG. 16 shows a flow chart of an integrated process for forming a gate electrode stack in a CVD tool in accordance with this invention.

FIG. 16 shows a flow chart of an integrated process for forming a gate electrode stack in a CVD tool in accordance with this invention.

Figure 17:
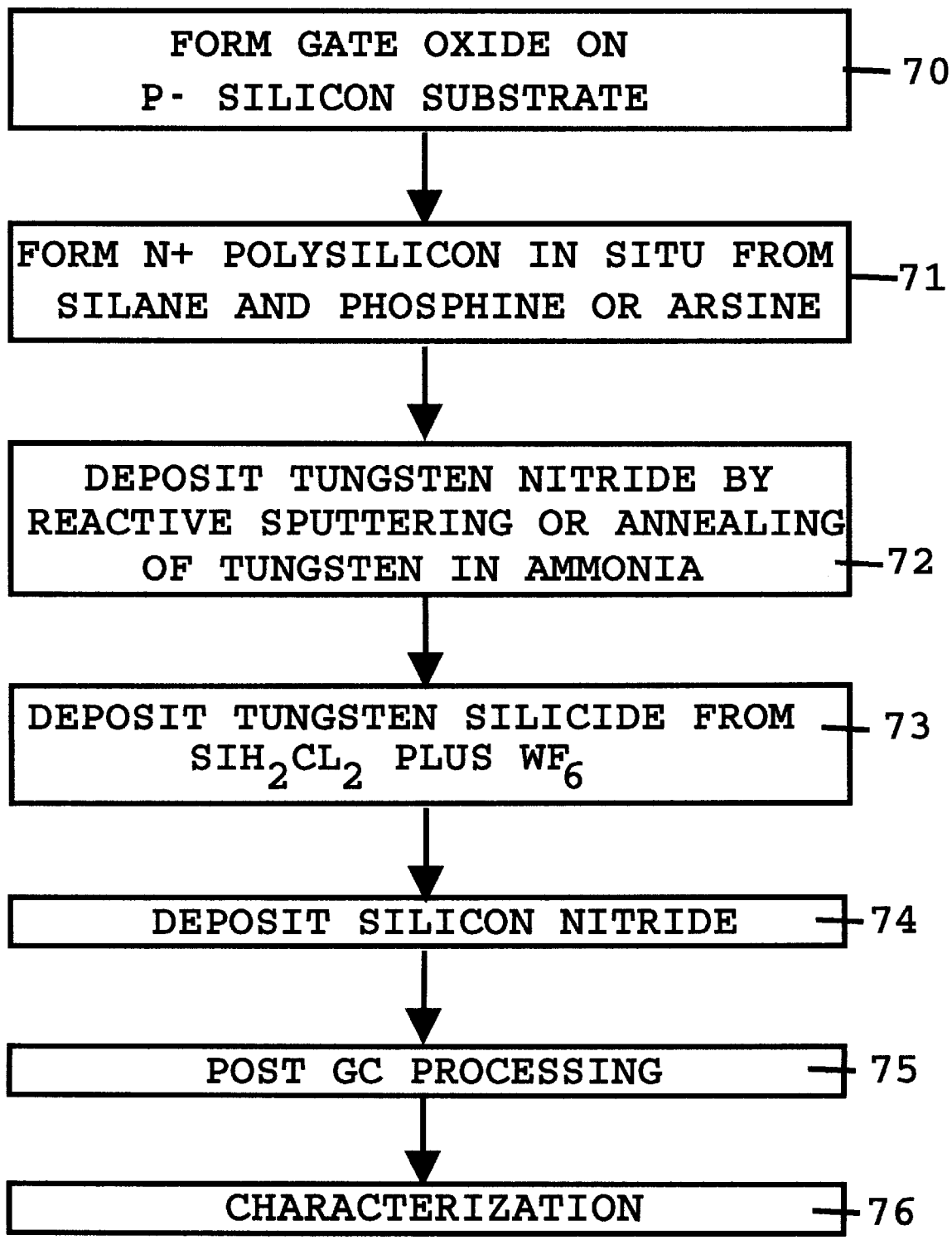
FIG. 17 shows a flow chart of another integrated process for forming a gate electrode stack in a CVD tool in accordance with this invention.

FIG. 17 shows a flow chart of another integrated process for forming a gate electrode stack in a CVD tool in accordance with this invention.

Fabrication of a polycide GC stack with a dopant diffusion barrier can be done in an integrated processing system such as a commercial polycide system or a conventional sputtering tool.

Referring to FIG. 14 an embodiment of a method of this invention is described including a set of process steps in accordance with this invention are described as follows:

1) In step 40 (as shown in FIG. 6) a silicon dioxide, gate oxide layer 18 (with a thickness from about 4 or 5 nm to about 10 nm) is formed over N– well 17 in exposed surfaces.
2) In step 41, form N+ doped polysilicon 20 using an in situ CVD doped process (doping with phosphorus or arsenic) from silane and either arsine ($AsH_3$) or phosphine ($PH_3$) on gate oxide layer 18.
3) In step 42 tungsten nitride is deposited onto the surface of polysilicon layer 20.
4) Step 43, tungsten silicide is deposited from dichlorosilane ($WSiH_2Cl_2$) and tungsten hexafluoride ($WF_6$).
5) In step 45 a silicon nitride ($Si_3N_4$) cap layer 26 is deposited by CVD over the device 10 at a temperature from about 720° C. to about 800° C. from about 30 minutes to about 150 minutes.
6) In step 46, post GC processing steps are performed including high temperature RTA (Rapid Thermal Annealing) at about 1000° C. to about 1050° C. for about 10 seconds to about 60 seconds during which a tungsten rich tungsten nitride (WN) is formed with the $W_2N$ phase. Since the atomic packing density of $W_2N$ phase is higher than that of W or $WSi_x$, the dopant (or metal contamination) through $W_2N$ will be retarded confining the dopant to the polysilicon layer and metallic contamination to the $WSi_x$ layer.
7) In step 47, impurity profiling is performed by a process, such as Secondary Ion Mass Spectrometry (SIMS) or Spreading Resistance Profiling (SRP), to determine the concentration of dopant vs. depth from the surface of the GC stack. Examples are shown in FIGS. 18–21.

Referring to FIG. 15 another embodiment of a method of this invention is described including a set of process steps in accordance with this invention are described as follows:

1) In step 50 a silicon dioxide, gate oxide layer 18 is formed on N– well 18 (as shown in FIG. 6, with a thickness from about 4 nanometers to about 10 nanometers) over exposed surfaces 11'.
2) In step 51, intrinsic polysilicon is deposited on the gate oxide layer 18.
3) In step 52 tungsten nitride is deposited on the surface of the intrinsic polysilicon.
4) In step 54, tungsten silicide is deposited.
5) In step 55 arsenic or phosphorus is ion implanted.
6) In step 56, silicon nitride layer 26 cap layer is deposited on the tungsten silicide layer 24 at a temperature from about 720° C. to about 800° C. from about 30 minutes to about 150 minutes.
7) In step 57, post GC processing steps are performed including high temperature RTA (Rapid Thermal Annealing) at about 1000° C. to about 1050° C. for about 10 seconds to about 60 seconds during which a tungsten rich tungsten nitride (WN) is formed with the $W_2N$ phase. Since the atomic packing density of $W_2N$ phase is higher than that of W or $WSi_x$, the dopant (or metal contamination) through $W_2N$ will be retarded confining the dopant to the polysilicon layer and metallic contamination to the $WSi_x$ layer.
8) In step 58, profiling is process is performed, by a process such as SIMS or SRP.

Referring to FIGS. 16 and 17, an embodiment of a method in accordance with this invention includes a set of process steps which are described as follows:

1) In step 60 (as shown in FIG. 6) a silicon dioxide, gate oxide layer 18, with a thickness from about 4 nm to about 20 nm, is formed over exposed surfaces 11'.
2) In step 61, a process is performed, in situ by sequential deposition of phosphorus doped polysilicon 20 over gate oxide layer 18 from silane ($SiH_4$) and phosphine ($PH_3$) gases.
3) In step 62, tungsten nitride ($W_yN$) layer 22 is deposited from tungsten hexafluoride ($WF_6$) plus ammonia gas $NH_3$ plus hydrogen gas ($H_2$).
4) In step 63, tungsten silicide ($WSi_x$) layer 24 is deposited from dichlorosilane and tungsten hexafluoride over tungsten nitride layer 22.
5) In step 64 a silicon nitride ($Si_3N_4$) cap layer 26 is deposited by CVD over tungsten silicide layer 24 on the device 10 at a temperature from about 720° C. to about 800° C. from about 30 minutes to about 150 minutes.
6) In step 65, post GC processing steps are performed including high temperature RTA (Rapid Thermal Annealing) at about 1000° C. to about 1050° C. for about 10 seconds to about 60 seconds during which a tungsten rich tungsten nitride (WN) is formed with the $W_2N$ phase. Since the atomic packing density of $W_2N$ phase is higher than that of W or $WSi_x$, the dopant (or metal contamination) through $W_2N$ will be retarded confining the dopant to the polysilicon layer and metallic contamination to the $WSi_x$ layer.
7) In step 66, profiling is performed by a process such as SIMS or SRP.

Referring to FIG. 17 a set of process steps in accordance with this invention are as follows:

1) In step 70 a silicon dioxide, gate oxide layer 18 of thickness from about 4 nm to about is formed in exposed surfaces 11'.
2) In step 71, form N+ doped polysilicon 20 using an in situ CVD doped process (doping with phosphorus or arsenic) from silane ($SiH_4$) and arsine ($AsH_3$) or phosphine ($PH_3$) of doped polysilicon layer 20 over gate oxide layer 18.
3) In step 72, tungsten nitride ($W_yN$) layer 22 is deposited over polysilicon layer 20 by reactive sputtering or annealing of tungsten in ammonia, e.g. ($WF_6$) plus ammonia gas $NH_3$ plus hydrogen gas ($H_2$).
4) In step 73, tungsten silicide ($WSi_x$) layer 24 is deposited over tungsten nitride ($W_yN$) layer 22 from dichlorosilane and tungsten hexafluoride.
6) In step 74, a silicon nitride ($Si_3N_4$) cap layer 26 is deposited by CVD over tungsten silicide layer 24 on the device 10 at a temperature from about 720° C. to about 800° C. from about 30 minutes to about 150 minutes.

7) In step 75, post GC processing steps are performed including high temperature RTA (Rapid Thermal Annealing) at about 1000° C. to about 1050° C. for about 10 seconds to about 60 seconds during which a tungsten rich tungsten nitride (WN) is formed with the $W_2N$ phase. Since the atomic packing density of $W_2N$ phase is higher than that of W or $WSi_x$, the dopant (or metal contamination) through $W_2N$ will be retarded confining the dopant to the polysilicon layer and metallic contamination to the $WSi_x$ layer.

8) In step 76, profiling is performed by a process such as SIMS or SRP.

Figure 18:
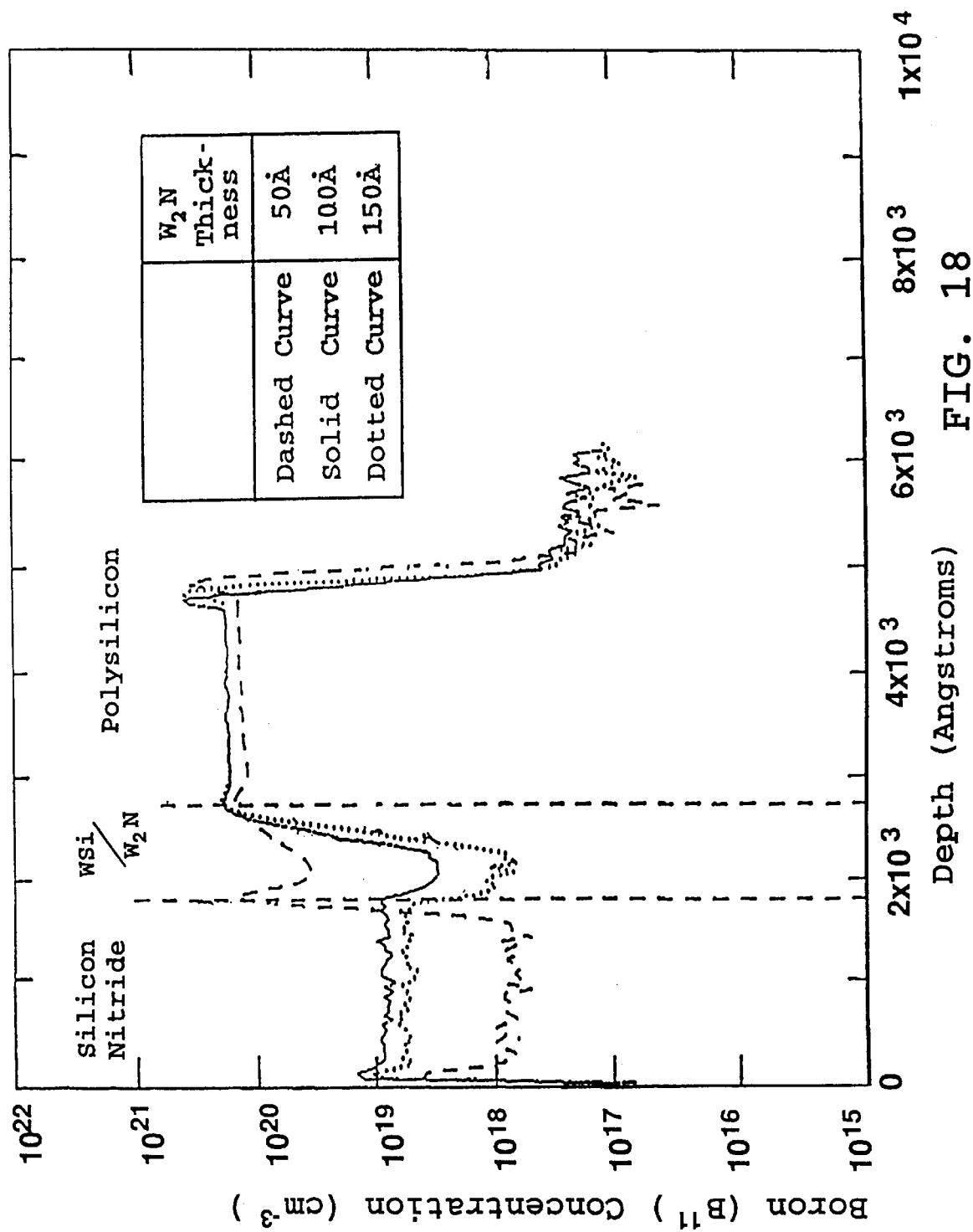
FIG. 18 shows graph of a profile of phosphorus in the presence of a $W_2N$ (tungsten nitride) barrier.

FIG. 18 shows a profile of phosphorus in the presence of a $W_2N$ (tungsten nitride) barrier. This is a SIMS profile of diffusion of phosphorus through three thicknesses of tungsten nitride ($W_2N$) with three curves of dopant concentration (atoms/$cm^3$) showing phosphorus concentration vs. depth into the GC stack for thicknesses of tungsten nitride in curve A of 50 Å (dashed curve), in curve B of 100 Å (solid curve) and in curve C of 150 Å (dotted curve). There are two vertical dashed lines on the graph which indicate the layers in the GC stack of silicon nitride (nitride) from 0 to about 1800 Å followed by WSi/WN to a thickness of about 2700 Å, where the polysilicon layer begins.

For curve A (50 Å), there is a reduction of dopant concentration from about $2\times10^{20}$ atoms/$cm^3$ at the polysilicon to $W_2N$ interface to about $5\times10^{19}$ atoms/$cm^3$ within the tungsten silicide (WSi). For curve B (100 Å), there is a reduction of dopant concentration from about $2\times10^{20}$ atoms/$cm^3$ at the polysilicon to $W_2N$ interface to about $5\times10^{18}$ atoms/$cm^3$ within the WSi. For curve C (150 Å), there is a reduction of dopant concentration from about $2\times10^{20}$ atoms/$cm^3$ at the polysilicon to $W_2N$ interface to about $1\times10^{18}$ atoms/$cm^3$ within the WSi.

For all three curves, at about 2,700 Å, at the transition between WSi/WN and the polysilicon there is no pile up where the three curves reach a high value of about $10^{20}$ atoms/$cm^3$. Phosphorus concentration is essentially uniform within the polysilicon layer from the $W_yN$ interface to the depth of about 4,000 Å–5,000 Å where phosphorus segregates.

Figure 19:
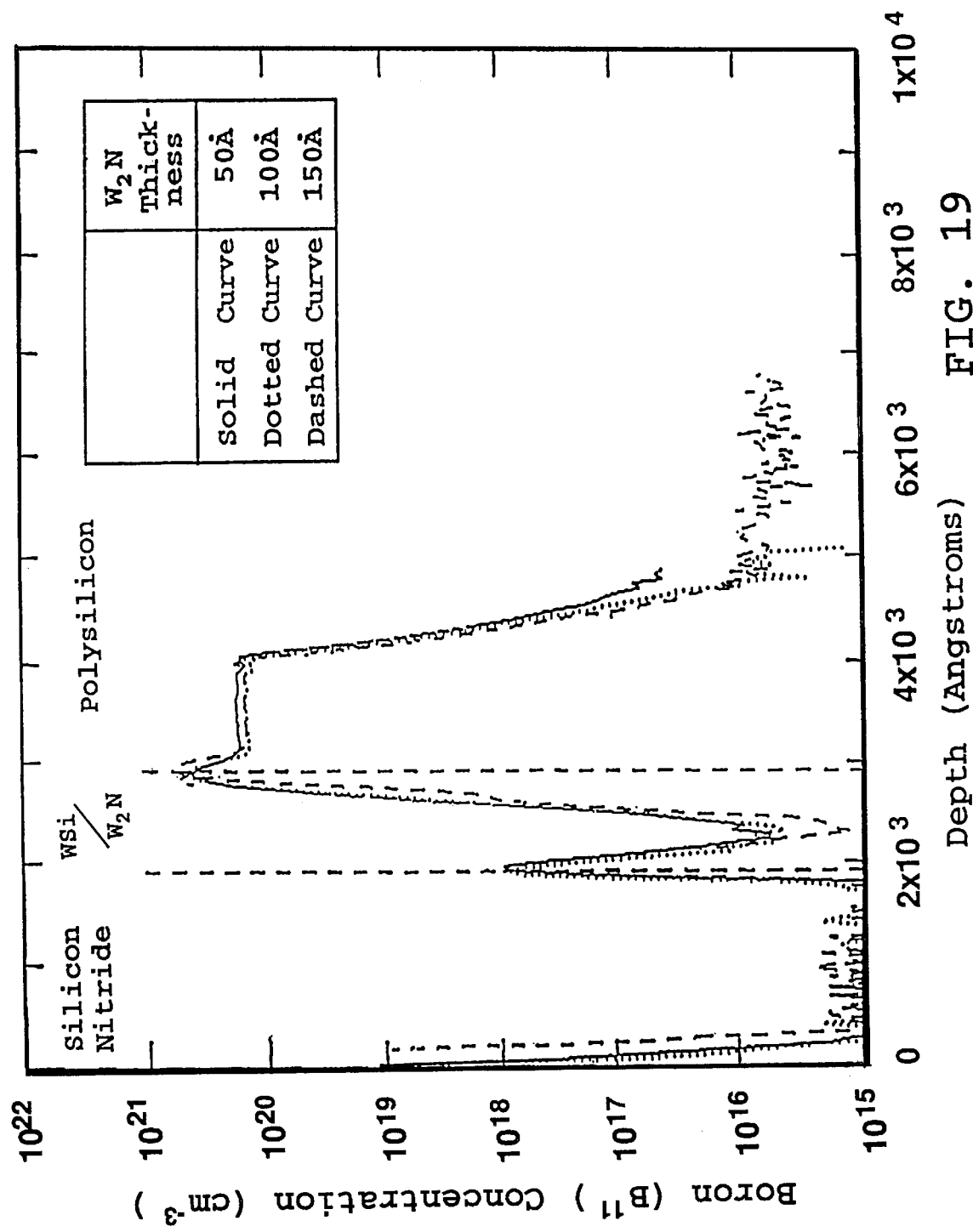
FIG. 19 shows graph of a profile of boron in the presence of a $W_2N$ (tungsten nitride) barrier.

FIG. 19 shows a graph of a profile of boron in the presence of a $W_2N$ (tungsten nitride) barrier. The graph shows diffusion of boron through tungsten nitride (WN) with three curves of dopant concentration (atoms/$cm^3$) vs Depth for thicknesses of tungsten nitride in curve A of 50 Å (solid curve), in curve B of 100 Å (dotted curve) and in curve C of 150 Å (dashed curve).

For all three curves at about 1,800 Å there is a $B^{10}$, $B^{12}$ mixture contamination which falls away quickly in the silicon nitride layer with a peak value of about $1\times10^{19}$ atoms/$cm^3$. In the polysilicon, near the $WSi/W_2N$ to polysilicon interface, the $B^{11}$ concentration exceeds $10^{20}$ atoms/$cm^3$. Note that there is less boron penetration in silicon under the polysilicon gate in the range from 100 Å to 150 Å of tungsten nitride.

Figure 20:
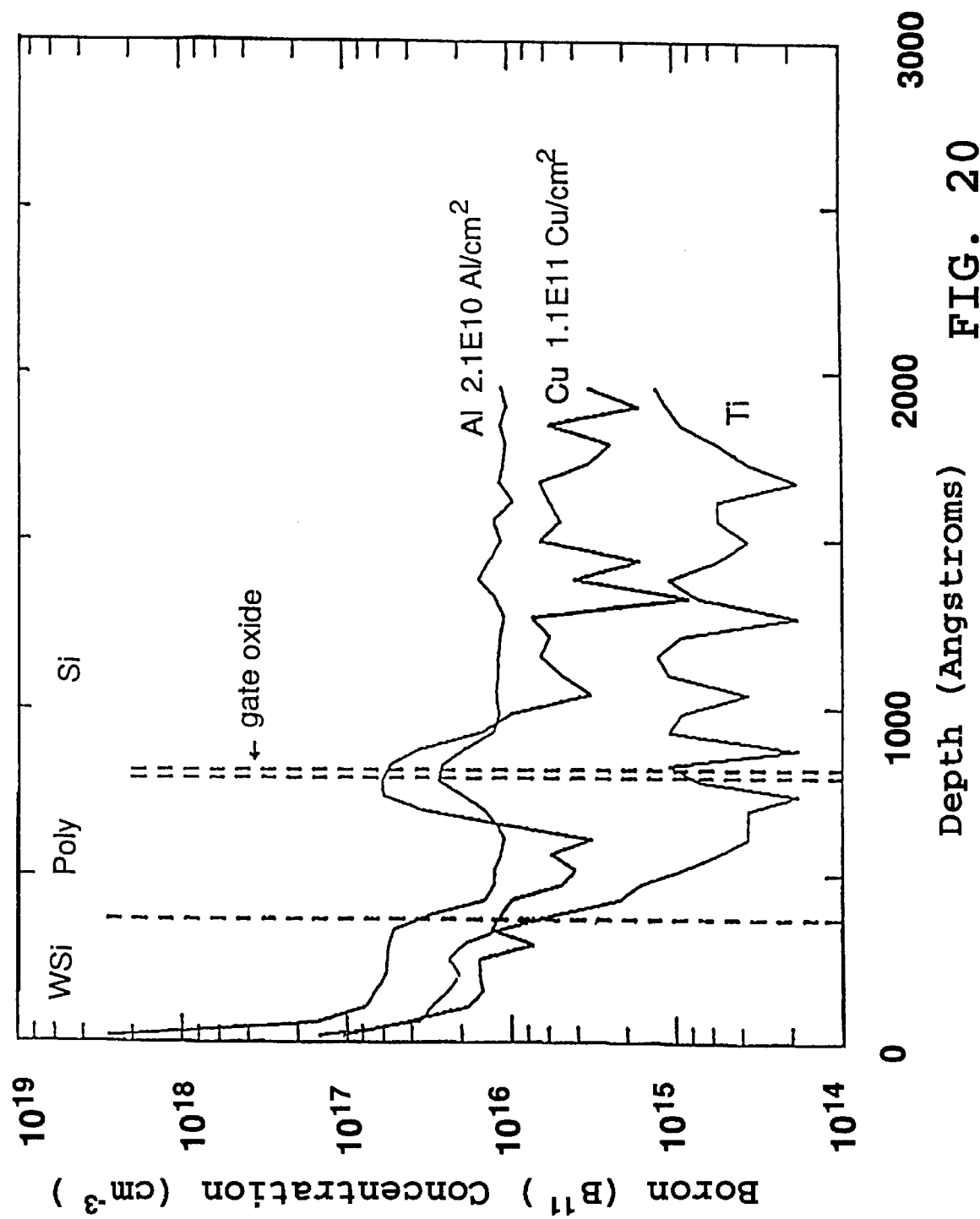
FIG. 20 shows a graph of metallic contamination of the gate oxide at the end of process anneals showing the concentrations of aluminum, copper and titanium penetrating through the layers in the order of WSi, polysilicon, gate oxide, and silicon substrate in a stack without the $W_2N$ diffusion barrier.

FIG. 20 shows a graph of metal penetration into silicon in the absence of a $W_2N$ (tungsten nitride) barrier. The graph shows metallic contamination of the gate oxide at the end of process anneals showing the concentrations of aluminum, copper and titanium penetrate through the layers in the order of WSi, polysilicon, gate oxide, and silicon substrate in a stack without the $W_2N$ diffusion barrier. The concentrations are for a dose of $2.1\times10^{10}$ Al atoms/$cm^2$, a dose of $1.1\times10^{11}$ Cu atoms/$cm^2$. Metallic materials such as Al and Cu will degrade the integrity of the gate oxide. No measurable metal penetration has been observed in the presence of a $W_2N$ barrier layer.

Figure 21:
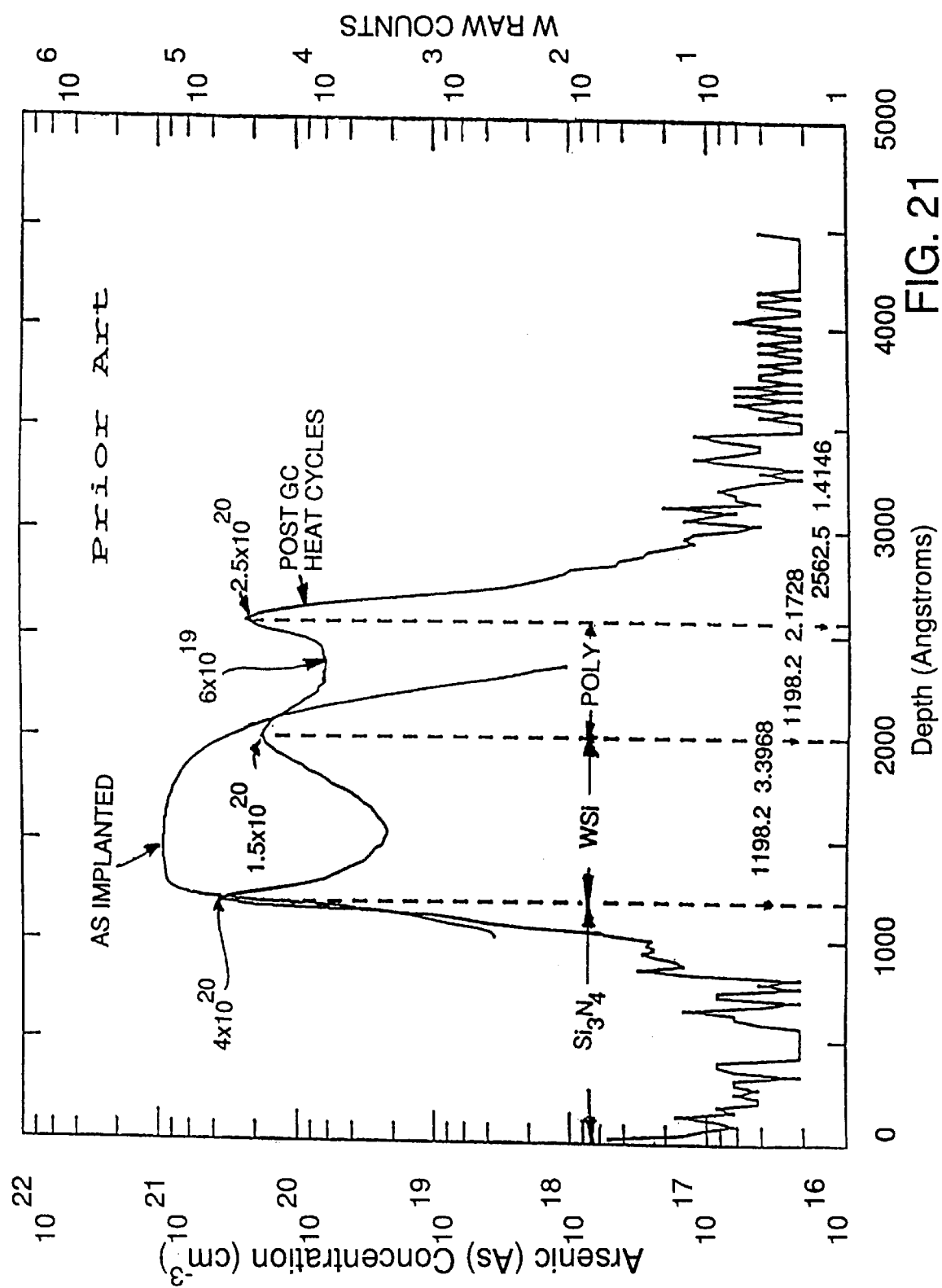
FIG. 21 shows a SIMS arsenic graph of a profile in the absence of a $W_2N$ (tungsten nitride) barrier, as practiced in the prior art. In particular

FIG. 21 shows a SIMS arsenic graph of a profile in the absence of a $W_2N$ (tungsten nitride) barrier. In particular FIG. 21 is a graph of arsenic diffusion through a polycide structure without a tungsten nitride ($W_2N$) barrier. The dopant concentration is reduced to below $6\times10^{19}$ atoms/$cm^3$ in the polysilicon. The reduction will degrade the performance of the FET.

Alternative Embodiments

While this invention has been shown and describe din detail for a PMOS embodiment, it will be well understood by those skilled in the art that the techniques and designs of this invention are also applicable to NMOS devices which can be achieved simply by changing the doping polarities from P to N in the source/drain regions and by changing the doping polarities form N to P in the substrate or wells. The polysilicon gate electrodes can be doped P-type or N-type depending upon the particular application as will be understood by those skilled in the art.

Aside from the details of the NMOS and PMOS embodiments, while this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a MOSFET device on a P-doped semiconductor substrate comprising:

forming an N− well therein, forming a pair of isolation regions in said N− well, forming a gate oxide layer above said N− well, forming a gate electrode above said gate oxide layer said gate electrode comprising a stack of gate layers as follows:

forming a doped polysilicon layer on said gate oxide layer, forming a dopant barrier layer of tungsten rich tungsten nitride ($W_2N$) upon said polysilicon layer, and forming a tungsten silicide layer upon said dopant barrier layer, and forming a silicon nitride cap layer above said stack on the surface of tungsten silicide layer, and then patterning said stack of gate layers into a patterned gate electrode, and then forming source and drain regions within said N-well self-aligned with said patterned gate electrode.

2. A method in accordance with claim 1 including:

forming vertical oxide sidewalls adjacent to said polysilicon, dopant barrier, and tungsten silicide layers.

3. A method in accordance with claim 1 including:

forming vertical oxide sidewalls adjacent to said polysilicon, dopant barrier, and tungsten silicide layers, and forming silicon nitride spacers adjacent to said stack including said cap layer and said sidewalls.

4. A method in accordance with claim 1 including:

forming vertical oxide sidewalls adjacent to said polysilicon, dopant barrier, and tungsten silicide layers, and forming lightly doped source/drain extension regions adjacent to said source/drain regions in said N– well beneath said extension regions with the channel of said FET device therebetween.

5. A method in accordance with claim 1 including:

forming vertical oxide sidewalls adjacent to said polysilicon, dopant barrier, and tungsten silicide layers, forming lightly doped source/drain extension regions adjacent to said source/drain regions in said N– well beneath said extension regions with the channel of said FET device therebetween, forming vertical sidewalls adjacent to said polysilicon, dopant barrier, and tungsten silicide layers, and forming silicon nitride spacers adjacent to said stack including said cap layer.

6. A method of manufacture of a MOSFET device comprising with a thin gate electrode conductor:

forming a doped semiconductor substrate with a counter-doped well formed therein, with a pair of isolation regions formed in said well with a gate oxide layer formed above said well, an FET defined by a gate electrode that is formed above said gate oxide layer with source and drain regions self-aligned to said gate electrode and formed within said well, a control gate electrode formed above said gate oxide layer aligned with said source and drain regions, forming said gate electrode into a stack of thin gate electrode conductor layers as follows:

forming a polysilicon layer on said gate oxide layer having a thickness from about 50 nm to about 250 m, said polysilicon layer being doped with dopant, forming a tungsten rich tungsten nitride dopant barrier layer upon said polysilicon layer
having a thickness from about 5 nm to about 10 nm, forming a tungsten silicide layer upon said tungsten nitride layer having a thickness from about 50 nm to about 250 nm, forming a silicon nitride cap layer above said stack on the surface of tungsten silicide layer having a thickness from about 75 nm to about 200 nm, and patterning said stack of gate layers into a patterned gate, and then forming source and drain regions within said N-well self-aligned with said patterned gate.

7. A method in accordance with claim 6 including:

forming vertical oxide sidewalls adjacent to said polysilicon, tungsten nitride and tungsten silicide layers.

8. A method in accordance with claim 6 including:

forming vertical oxide sidewalls adjacent to said polysilicon, dopant barrier, and tungsten silicide layers, said tungsten nitride layer comprises tungsten rich $W_2N$, and forming silicon nitride spacers adjacent to said stack including said cap layer and said vertical oxide sidewalls.

9. A method in accordance with claim 6 including:

forming vertical oxide sidewalls adjacent to said polysilicon, tungsten nitride and tungsten silicide layers, said tungsten nitride layer comprises tungsten rich $W_2N$, and forming lightly doped source/drain extension regions adjacent to said source/drain regions in said N– well beneath said extension regions with the channel of said FET device therebetween.

10. A method in accordance with claim 6 including forming vertical sidewalls adjacent to said polysilicon, tungsten nitride and tungsten silicide layers, forming lightly doped source/drain extension regions adjacent to said source/drain regions in said N– well beneath said extension regions wit the channel of said FET device therebetween, forming vertical sidewalls adjacent to said polysilicon, tungsten nitride and tungsten silicide layers, said tungsten nitride layer comprises tungsten rich $W_2N$, and forming silicon nitride spacers adjacent to said stack including said cap layer.

11. A method of manufacture of a MOSFET device on a doped semiconductor substrate comprising:

forming a gate oxide layer above said substrate, forming a gate electrode above said gate oxide layer said gate electrode comprising a stack of gate layers as follows:

forming a doped polysilicon layer on said gate oxide layer, forming a dopant barrier layer of tungsten rich tungsten nitride ($W_2N$) upon said polysilicon layer, and forming a tungsten silicide layer upon said dopant barrier layer, and forming a silicon nitride cap layer above said stack on the surface of tungsten silicide layer, and then patterning said stack of gate layers into a patterned gate electrode, and forming source and drain regions within said substrate self-aligned with said patterned gate electrode.

12. A method in accordance with claim 11 including:

forming vertical oxide sidewalls adjacent to said polysilicon, dopant barrier, and tungsten silicide layers.

13. A method in accordance with claim 11 including:

forming vertical oxide sidewalls adjacent to said polysilicon, dopant barrier, and tungsten silicide layers, and forming silicon nitride spacers adjacent to said stack including said cap layer and said vertical oxide sidewalls.

14. A method in accordance with claim 11 including:

forming vertical oxide sidewalls adjacent to said polysilicon, dopant barrier, and tungsten silicide layers, and forming lightly doped source/drain extension regions adjacent to said source/drain regions in said N– well beneath said extension regions with the channel of said FET device therebetween.

15. A method in accordance with claim 11 including:

forming vertical oxide sidewalls adjacent to said polysilicon, dopant barrier, and tungsten silicide layers, forming lightly doped source/drain extension regions adjacent to said source/drain regions in said N– well beneath said extension regions with the channel of said FET device therebetween, forming vertical sidewalls adjacent to said polysilicon, dopant barrier, and tungsten silicide layers, and forming silicon nitride spacers adjacent to said stack including said cap layer.

16. A method of manufacture of a MOSFET device comprising:

forming a doped semiconductor substrate with a with a gate oxide layer formed above said substrate, an FET defined by a gate electrode that is formed above said gate oxide layer with source and drain regions self-aligned to said gate electrode and formed within said substrate, a gate electrode formed above said gate oxide layer aligned with said source and drain regions, forming said gate electrode into a stack of gate layers as follows:
- forming a polysilicon layer on said gate oxide layer having a thickness from about 50 nm to about 250 nm, said polysilicon layer being doped with dopant,
- forming a tungsten nitride dopant barrier layer upon said polysilicon layer having a thickness from about 5 nm to about 20 nm, said tungsten nitride is tungsten rich $W_2N$,
- forming a tungsten silicide layer upon said tungsten nitride layer having a thickness from about 50 nm to about 250 nm,
- forming a silicon nitride cap layer above said stack on the surface of tungsten silicide layer having a thickness from about 75 nm to about 200 nm, and
- patterning said stack of gate layers into a patterned gate, and
- then forming source and drain regions within said N-well self-aligned with said patterned gate.

17. A method in accordance with claim 16 including:

forming vertical oxide sidewalls adjacent to said polysilicon, tungsten nitride and tungsten silicide layers.

18. A method in accordance with claim 16 including:

forming vertical oxide sidewalls adjacent to said polysilicon, dopant barrier, and tungsten silicide layers, said tungsten rich $W_2N$ is formed by rapid thermal annealing at from about 1000° C. to about 1050° C. for from about 10 seconds to about 60 seconds, and forming silicon nitride spacers adjacent to said stack including said cap layer and said vertical oxide sidewalls.

19. A method in accordance with claim 16 including:

forming vertical oxide sidewalls adjacent to said polysilicon, tungsten nitride and tungsten silicide layers, said tungsten rich $W_2N$ is formed by rapid thermal annealing at from about 1000° C. to about 1050° C. for from about 10 seconds to about 60 seconds, and forming lightly doped source/drain extension regions adjacent to said source/drain regions i said N– well beneath said extension regions with the channel of said FET device therebetween.

20. A method in accordance with claim 16 including:

said tungsten rich $W_yN$ is formed by rapid thermal annealing at from about 1000° C. to about 1050° C. for from about 10 seconds to about 60 seconds, forming vertical sidewalls adjacent to said polysilicon, tungsten nitride and tungsten silicide layers, forming lightly doped source/drain extension regions adjacent to said source/drain regions in said N– well beneath said extension regions with the channel of said FET device therebetween, forming vertical sidewalls adjacent to said polysilicon, tungsten nitride and tungsten silicide layers, and forming silicon nitride spacers adjacent to said stack including said cap layer.

21. A method in accordance with claim 16 including:

said tungsten rich $W_2N$ is formed by depositing silicon nitride onto said tungsten silicide layer at from about 720° C. to about 800° C. from about 30 minutes to about 150 minutes followed by rapid thermal annealing at from about 1000° C. to about 1050° C. for from about 10 seconds to about 60 seconds, forming vertical sidewalls adjacent to said polysilicon, tungsten nitride and tungsten silicide layers, forming lightly doped source/drain extension regions adjacent to said source/drain regions in said N– well beneath said extension regions with the channel of said FET device therebetween, forming vertical sidewalls adjacent to said polysilicon, tungsten nitride and tungsten silicide layers, and forming silicon nitride spacers adjacent to said stack including said cap layer.

22. A method in accordance with claim 16 including:

said tungsten rich $W_2N$ is formed by depositing silicon nitride onto said tungsten silicide layer at from about 720° C. to about 800° C. from about 30 minutes to about 150 minutes followed by rapid thermal annealing at from about 1000° C. to about 1050° C. for a time from about 10 seconds to about 60 seconds, forming vertical sidewalls adjacent to said polysilicon, tungsten nitride and tungsten silicide layers, forming lightly doped source/drain extension regions adjacent to said source/drain regions in said N– well beneath said extension regions with the channel of said FET device therebetween, forming vertical sidewalls adjacent to said polysilicon, tungsten nitride and tungsten silicide layers, and forming silicon nitride spacers adjacent to said stack including said cap layer.

23. A method in accordance with claim 16 including:

said tungsten rich $W_2N$ is formed by depositing silicon nitride by CVD onto said tungsten silicide layer at form about 720° C. to about 800° C. from about 30 minutes to about 150 minutes followed by rapid thermal annealing at from about 1000° C. to about 1050° C. for from about 10 seconds to about 60 seconds, forming vertical sidewalls adjacent to said polysilicon, tungsten nitride and tungsten silicide layers, forming lightly doped source/drain extension regions adjacent to said source/drain regions in said N– well beneath said extension regions with the channel of said FET device therebetween, forming vertical sidewalls adjacent to said polysilicon, tungsten nitride and tungsten silicide layers, and forming silicon nitride spacers adjacent to said stack including said cap layer.

* * * * *

UNITED STATES PATENT AND TRADEMARK OFFICE
CERTIFICATE OF CORRECTION

PATENT NO. : 5,923,999
DATED : July 13, 1999
INVENTOR(S) : Balasubramanyam et al.

It is certified that error appears in the above-identified patent and that said Letters Patent is hereby corrected as shown below:

Cover page     Under Attorney, Agent or Firm, please correct the name "Daryl K. Weff" to read -- Daryl K. Neff --;

Col. 3, line 17, correct "formed i a polysilicon" to read -- formed in a polysilicon --;

Col. 9, line 48, correct "$B^{12}$" to read -- $B^{11}$ --;

Col. 10, line 10, correct "describe din" to read -- described in --

Col. 12, line 7, correct "regions wit the" to read -- regions with the --;

Signed and Sealed this

Eighteenth Day of April, 2000

Attest:

Q. TODD DICKINSON

*Attesting Officer*     *Director of Patents and Trademarks*